US010068767B2

(12) United States Patent
Seo et al.

(10) Patent No.: US 10,068,767 B2
(45) Date of Patent: Sep. 4, 2018

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Young-Sik Seo, Hwaseong-si (KR); Seung-Heon Lee, Seoul (KR); Hyun-Woo Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 2 days.

(21) Appl. No.: 15/291,377

(22) Filed: Oct. 12, 2016

(65) Prior Publication Data

US 2017/0103892 A1  Apr. 13, 2017

(30) Foreign Application Priority Data

Oct. 13, 2015  (KR) .................... 10-2015-0142792

(51) Int. Cl.
  *H01L 21/302* (2006.01)
  *H01L 21/033* (2006.01)
  *H01L 21/3065* (2006.01)
  *H01L 21/311* (2006.01)
  *H01L 21/308* (2006.01)

(52) U.S. Cl.
  CPC ...... *H01L 21/0337* (2013.01); *H01L 21/3086* (2013.01); *H01L 21/30655* (2013.01); *H01L 21/31111* (2013.01); *H01L 21/31144* (2013.01)

(58) Field of Classification Search
  CPC .... H04L 63/102; H04L 63/126; H04W 12/08; H04W 12/12; H01L 21/31144; H01L 21/31138; H01L 21/3086; H01L 21/3088; H01L 21/0337; H01L 21/30655; H01L 21/31055; H01L 21/31111; G06Q 20/32
  USPC ....... 438/230, 639, 694, 706, 710, 712, 714, 438/719, 723, 736
  See application file for complete search history.

(56) References Cited

U.S. PATENT DOCUMENTS 8,076,229 B2 * 12/2011 Juengling ........... H01L 21/3081
                                                             438/585
8,173,357 B2 *  5/2012 Nishimura ......... H01L 21/0337
                                                             430/312
8,603,919 B2 * 12/2013 Han ................. H01L 21/02532
                                                             438/702

(Continued)

FOREIGN PATENT DOCUMENTS

JP       2014-090029 A    5/2014
KR  10-2008-0034234 A    4/2008

(Continued)

*Primary Examiner* — Lan Vinh
(74) *Attorney, Agent, or Firm* — Lee & Morse, P.C.

(57) ABSTRACT

A method for fabricating a semiconductor device includes forming a first mask pattern on a first film to extend in a first direction, forming a first spacer on either side wall of the first mask pattern, forming a second film to cover the first spacer and the first film, and forming a second mask pattern on the second film. The second mask pattern extends in a second direction different from the first direction. The method further includes forming a second spacer on either side wall of the second mask pattern, etching the first film using the first spacer and the second spacer as etch masks to form a contact pattern, and removing the first and second spacers to expose the contact pattern.

20 Claims, 30 Drawing Sheets

(56) References Cited

U.S. PATENT DOCUMENTS

| | | | |
|---|---|---|---|
| 8,889,560 B2 | 11/2014 | Chung et al. | |
| 8,912,097 B2 | 12/2014 | Martin et al. | |
| 2007/0082446 A1* | 4/2007 | Olligs | H01L 21/76897 438/264 |
| 2009/0068842 A1 | 3/2009 | Kim | |
| 2011/0195575 A1* | 8/2011 | Wang | H01L 21/02071 438/692 |
| 2014/0322915 A1 | 10/2014 | Lee et al. | |
| 2015/0024602 A1* | 1/2015 | Sant | H01L 21/3086 438/703 |
| 2016/0293419 A1* | 10/2016 | Nam | H01L 23/528 |

FOREIGN PATENT DOCUMENTS

| | | |
|---|---|---|
| KR | 10-2009-0027431 A | 3/2009 |
| KR | 10-2009-0067508 A | 6/2009 |
| KR | 10-2009-0067607 A | 6/2009 |
| KR | 10-2010-0072885 A | 7/2010 |

\* cited by examiner

1200

1300

1400

METHOD OF FABRICATING SEMICONDUCTOR DEVICE

CROSS-REFERENCE TO RELATED APPLICATION

Korean Patent Application No. 10-2015-0142792, filed on Oct. 13, 2015, and entitled, "Method of Fabricating Semiconductor Device," is incorporated by reference herein in its entirety.

BACKGROUND

1. Field

One or more embodiments described herein relate to a method for fabricating a semiconductor device.

2. Description of the Related Art

As technology improves, semiconductor devices become faster and better able to operate at lower voltage levels. In addition, the process of fabricating semiconductor devices has continued to increase the degree of integration. Accordingly, in a highly integrated large-scale semiconductor device, patterns have micro-widths and are spaced apart with fine pitch.

Double-patterning technology (DPT) is one approach that has been used to fabricate patterns in a highly integrated semiconductor device. When a DPT is applied, efforts are made to make circuit patterns and mask patterns for forming circuit patterns more uniform, in order to improve operation reliability. However, these and other approaches have drawbacks as presently implemented.

SUMMARY

In accordance with one or more embodiments, a method of fabricating a semiconductor device includes forming a first mask pattern on a first film, the first mask pattern extending in a first direction; forming a first spacer on either side wall of the first mask pattern; forming a second film to cover the first spacer and the first film; forming a second mask pattern on the second film, the second mask pattern extending in a second direction different from the first direction; forming a second spacer on either side wall of the second mask pattern; etching the first film using the first spacer and the second spacer as etch masks to form a contact pattern; and removing the first and second spacers to expose the contact pattern.

The method may include prior to removing the first and second spacers, forming a third film to cover the first and second spacers, wherein removing the first and second spacers includes removing the third film together with the first and second spacers. The third film may include a same material as the second film.

The method may include forming a mask film under the first film; and etching the mask film using the contact pattern as an etch mask to form a contact hole. The first film may include a material having a higher etch selectivity than the mask film. The first film may include one of polysilicon, silicon nitride, metal oxide, or metal nitride.

The method may include forming a first buffer film on the first film before forming the first mask, wherein forming the first spacer includes etching the first buffer film to form a first buffer film pattern. The first buffer film may include a same material as the first film. The method may include forming a second buffer film on the second film before forming the second mask, wherein forming the second spacer includes etching the second buffer film to form a second buffer film pattern.

In accordance with one or more other embodiments, a method of fabricating a semiconductor device includes forming a first mask film on a substrate, a second mask film on the first mask film, a first buffer film on the second mask film, a first sacrificial film on the first buffer film; etching the first sacrificial film to form a first sacrificial pattern extending in a first direction; forming a first spacer on either side wall of the first sacrificial pattern; etching the first buffer film using the first spacer as an etch mask to form a first mask pattern; forming a second buffer film over the first mask pattern and the second mask film, and forming a second sacrificial on the second buffer film; etching the second sacrificial film to form a second sacrificial pattern extending in a second direction different from the first direction; forming a second spacer on either side wall of the second sacrificial pattern; etching the second buffer film by using the second spacer as an etch mask to form a second mask pattern; etching the second mask film using the first mask pattern and the second mask pattern as etch masks to form a contact pattern; removing the first mask pattern, the first and second spacers to expose the contact pattern; and etching the first mask film using the contact pattern as an etch mask to form a contact hole.

The method includes, prior to removing the first mask pattern and the first and second spacers, forming a third sacrificial film to cover the contact pattern and the first and second spacers; and removing the third sacrificial film together with the first and second mask pattern. The third sacrificial film may include a same material as the second sacrificial film. The second mask film may include a same material as the first buffer film. The second mask film and the first buffer film may include silicon nitride or silicon. The method may include filling the contact hole with a conductive material to form a contact plug.

In accordance with one or more other embodiments, a method of fabricating a semiconductor device includes forming a first mask pattern on a first film, the first mask pattern extending in a first direction, forming a first spacer on either side wall of the first mask pattern; forming a second film to fill a space between the first spacer; forming a second mask pattern on the second film, the second mask pattern intersecting the first mask pattern; forming a second spacer on either side wall of the second mask pattern; etching the first film and the second film using the first spacer and the second spacer as etch masks to form a contact pattern; forming a sacrificial film to fill a space between the contact pattern and to cover the first spacer and the second spacer; and removing the sacrificial film together with the first spacer and the second spacer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
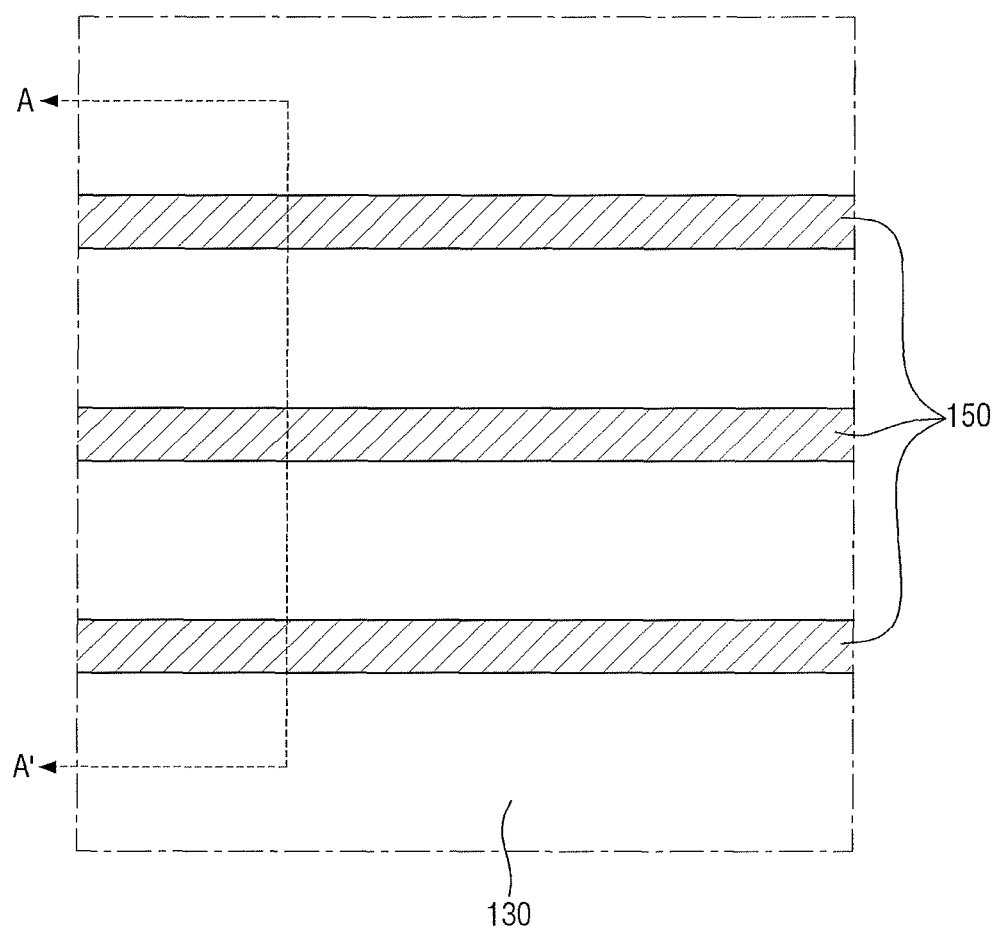
FIGS. 1A to 11B illustrate an embodiment of a method for fabricating a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the disclosure and is not a limitation on the scope of the disclosure unless otherwise specified. Further, unless defined otherwise, all terms defined in generally used dictionaries may not be overly interpreted.

Figure 1B:
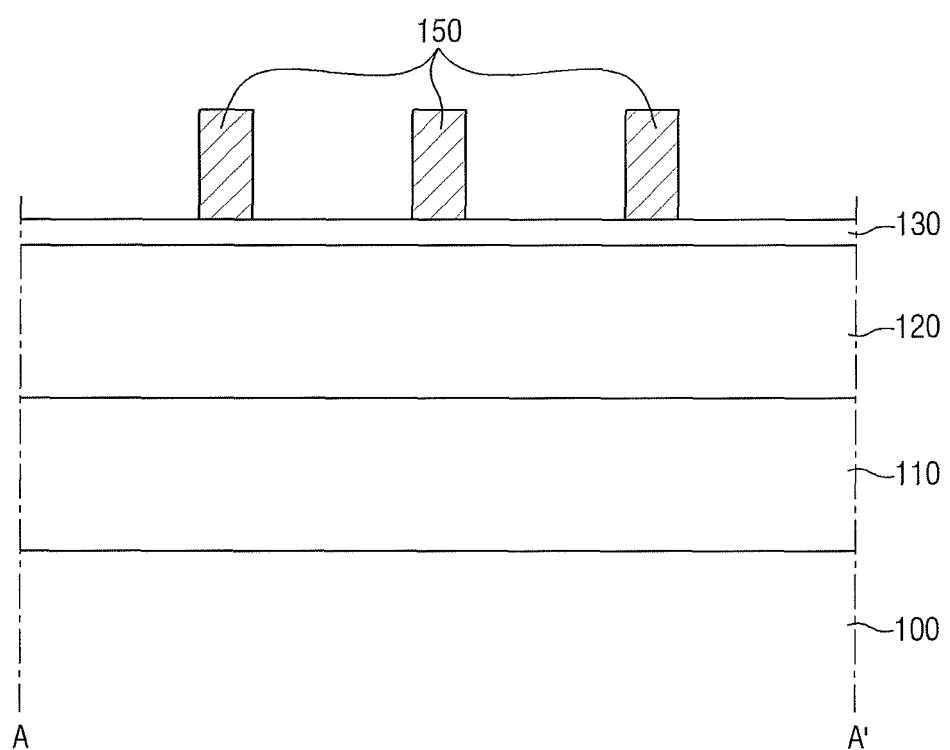

FIG. 1A illustrates a process operation in one embodiment of a method for fabricating a semiconductor device, and FIG. 1B illustrates a view taken along section line A-A' in FIG. 1A. Referring to FIGS. 1A and 1B, a first mask film 110 may be formed on a substrate 100, a second mask film 120 may be formed on the first mask film 110, a first buffer film 130 may be formed on the second mask film 120, and then a first sacrificial pattern 150 may be formed on the first buffer film 130.

The substrate 100 may be, for example, a silicon substrate, a bulk silicon substrate or a silicon-on-insulator (SOI) substrate. In one embodiment, the substrate 100 may include an element semiconductor such as germanium, or a compound semiconductor such as a Group IV-IV compound semiconductor or a Group III-V compound semiconductor. In one embodiment, the substrate 100 may be formed by disposing an epitaxial layer on a base substrate.

Examples of Group IV-IV compound semiconductor materials include a binary compound or a ternary compound containing at least two of carbon (C), silicon (Si), germanium (Ge), or tin (Sn), or such a compound doped with a Group IV element.

Examples of Group III-V compound semiconductor materials include a binary compound, a ternary compound or a quaternary compound including at least one of aluminum (Al), gallium (Ga), or indium (In) as the Group III element and one of phosphorous (P), arsenic (As), or antimony (Sb) as the Group V element.

The substrate 100 may include a capacitor formed therein. A contact may be formed by the method for fabricating a semiconductor device, and the capacitor in the substrate may be electrically connected to the contact.

The first mask film 110 on the substrate 100 may include, but is not limited to, silicon oxide. The first mask film 110 may be formed, for example, by performing the atomic layer deposition (ALD), the chemical vapor deposition (CVD) or the like, and may be additionally subject to a baking process or a curing process depending on the type of the material.

The second mask film 120 on the first mask film 110 may include a material having a higher etch selectivity than that of the first mask film 110. The second mask film 120 may include, but is not limited to, polysilicon, silicon nitride, metal oxide, or metal nitride.

When the second mask film 120 includes a material having a higher etch selectivity than that of the first mask film 110, the second mask film 120 may be used as a relatively thin etch mask in a subsequent process of forming a contact hole in the first mask film 110. As a result, the efficiency of the processing a semiconductor device may be increased. In addition, sufficient time may be allocated to the process of etching the first mask film 110 using part of the second mask film 120 as an etch mask. As a result, influence by an asymmetric pattern, when an asymmetric spacer is used as an etch mask, may be suppressed.

The first sacrificial pattern 150 may be formed on the first buffer film 130 to extend in a first direction. The first direction may be a traverse direction of the substrate as shown, for example, in FIG. 1A. The first sacrificial pattern 150 may be formed by disposing a first sacrificial film on the first buffer film 130 and then etching the first sacrificial film by using a photolithography process. The first sacrificial pattern 150 may include a spin-on hardmask (SOH). The first buffer film 130 may be formed between the second mask film 120 and the first sacrificial pattern 150. The first buffer film 130 may include, for example, silicon or silicon nitride.

In some exemplary embodiments, the second mask film 120 and the first buffer film 130 may include the same material. For example, instead of forming the second mask film 120 and the first buffer film 130 individually, the first buffer film 130 may be formed directly on the first mask film 110. By doing so, process complexity of the method may be reduced.

Figure 2A:
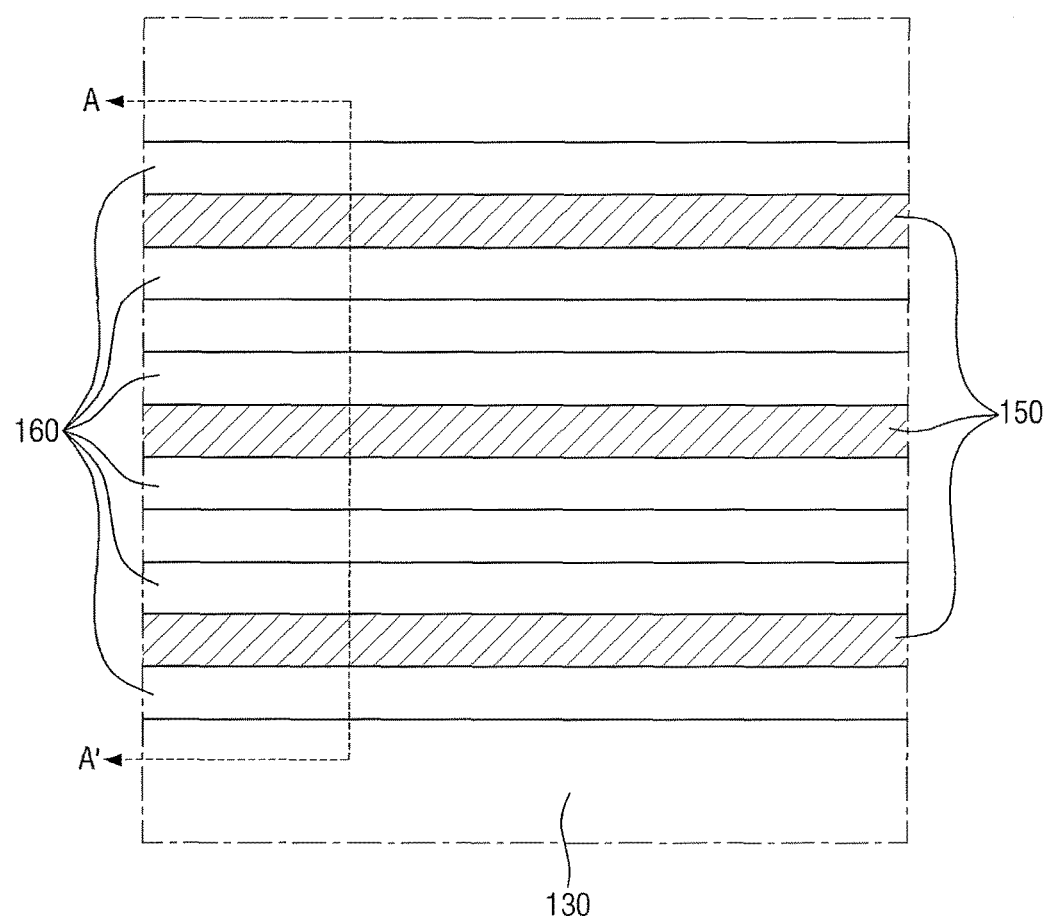
Figure 2B:
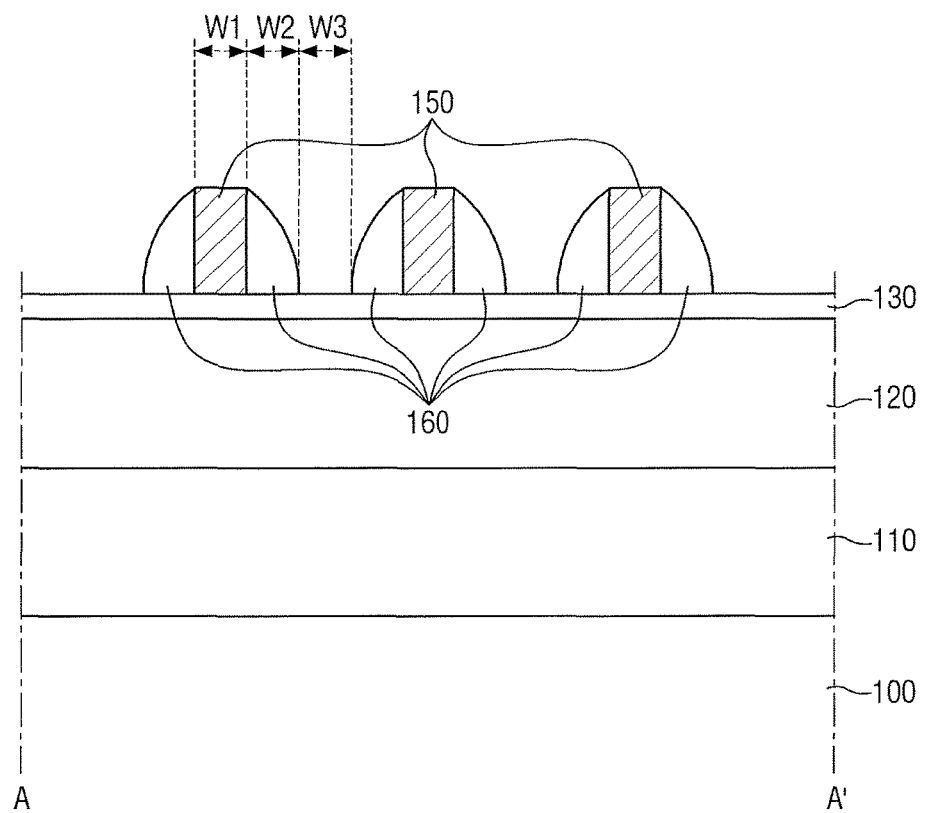

FIG. 2A illustrates another process operation according to the present method, and FIG. 2B illustrates a view taken along section line A-A' in FIG. 2A. Referring to FIGS. 2A and 2B, a first spacer 160 may be formed on either side wall of the first sacrificial pattern 150. In an area where a fine pattern pitch is required, multi-patterning may be carried out by forming the spacer 160 on either side wall of the sacrificial pattern 150 and then using the spacer 160 as an etch mask.

In one embodiment, the width w1 of the first sacrificial pattern 150, the width w2 of the first spacer 160, and the width w3 between the first spacer 160 and another first spacer 160 may be equal to one another. In another embodiment, the width w1 may be equal to the width w2 and the width w3 may be different from the width w1 or the width w2.

As described above, as multi-patterning is carried out on the second mask film 120 and the like using the first spacer 160 as an etch mask, the widths w1 to w3 may be smaller than the resolution of a photolithography apparatus.

The first spacer 160 may be formed, for example, by disposing a spacer film that covers the first buffer film 130 and the first sacrificial pattern 150 conformally and then etching back the spacer film. The spacer film may be formed, for example, by depositing a material having an etch selectivity different from the first buffer film 130 and that of the first sacrificial pattern 150 by the ALD. If the first sacrificial pattern 150 includes a spin-on hardmask (SOH), the spacer film may include, for example, silicon oxide or silicon nitride. The first spacer 160 is formed on either side wall of the first sacrificial pattern 150, and thus may extend in the same direction as the first sacrificial pattern 150, e.g., the first direction.

Figure 3A:
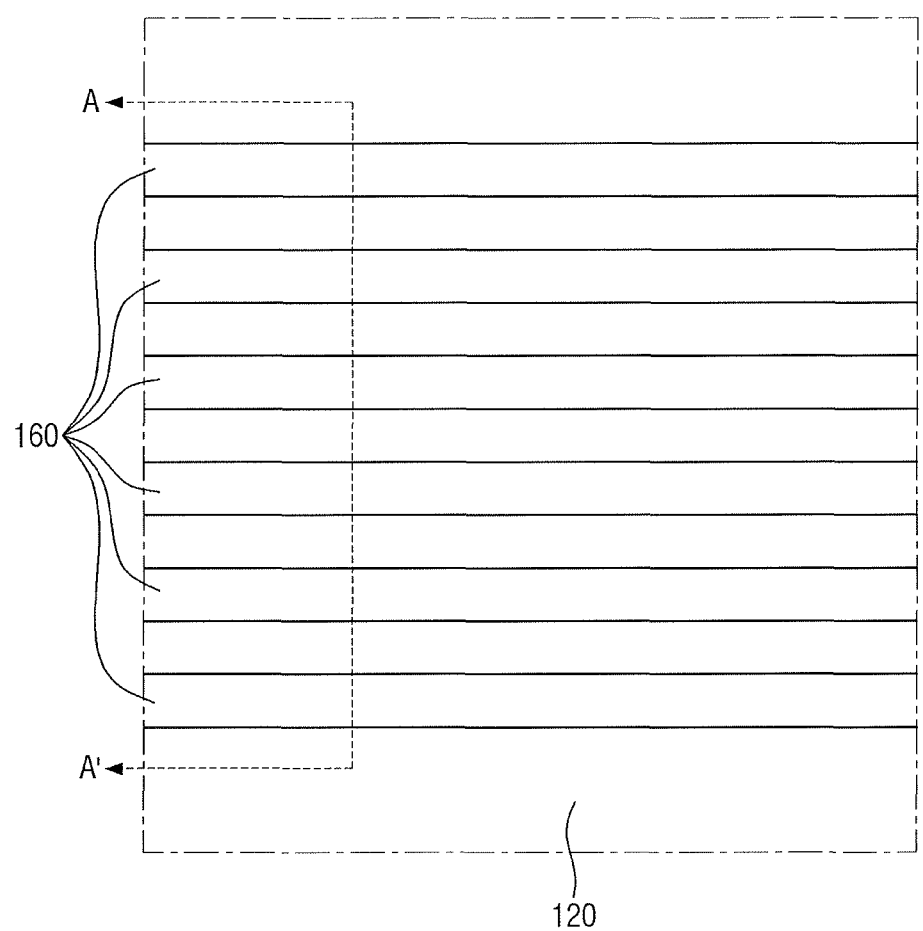
Figure 3B:
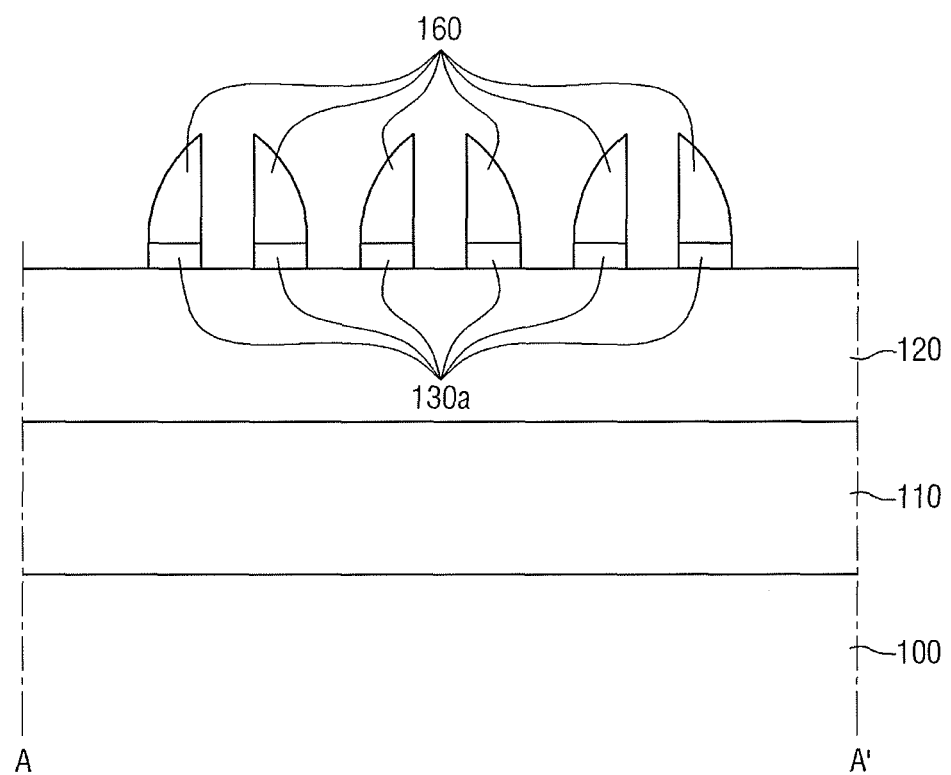

FIG. 3A illustrates another process operation according to the present method, and FIG. 3B illustrates a view taken along section line A-A' in FIG. 3A. Referring to FIGS. 3A and 3B, the first sacrificial pattern 150 (see, e.g., FIG. 2B) has been removed to form first spacers 160 spaced apart from one another. The first sacrificial pattern 150 may be removed, for example, by an ashing process or a cleaning process.

The first buffer film 130 may be removed together with the first sacrificial pattern 150 in the same process to expose the top surface of the second mask film 120. In addition, a first mask pattern 130a overlapping the first spacer 160 may be formed.

The second mask film 120 includes a material that is more resistant to etching than the first sacrificial pattern 150, so that it may not be removed during the process of removing the first sacrificial pattern 150.

Figure 4A:
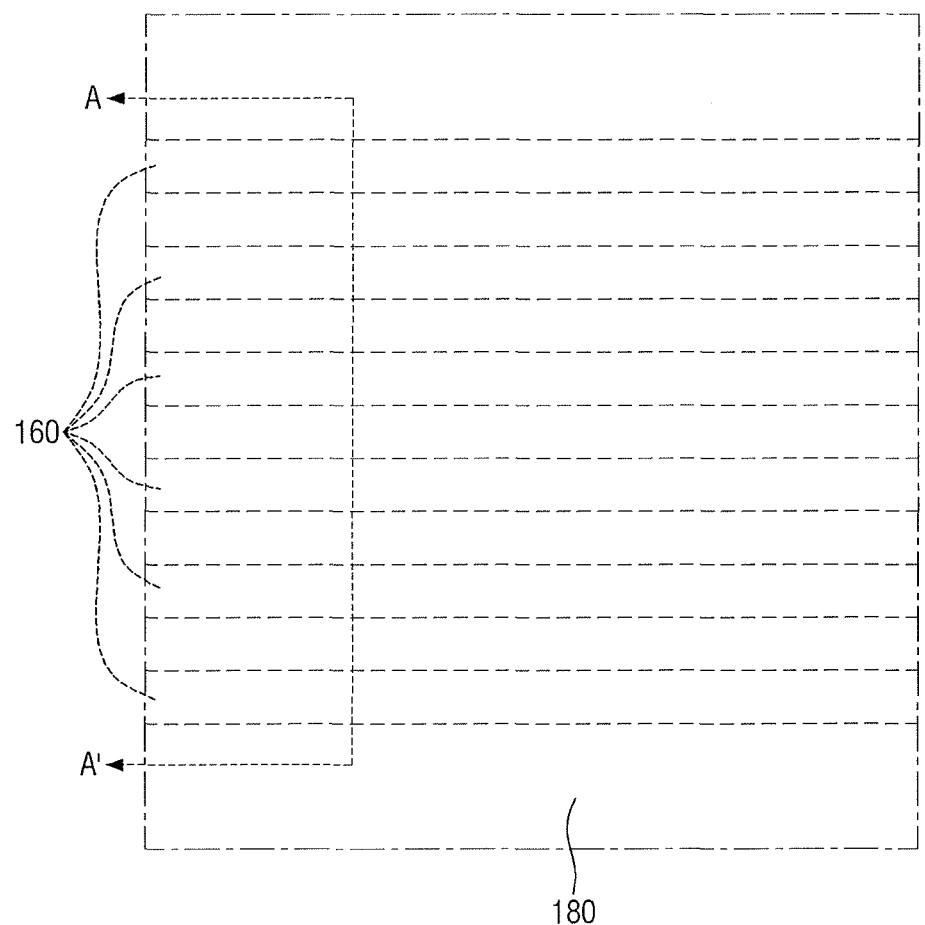
Figure 4B:
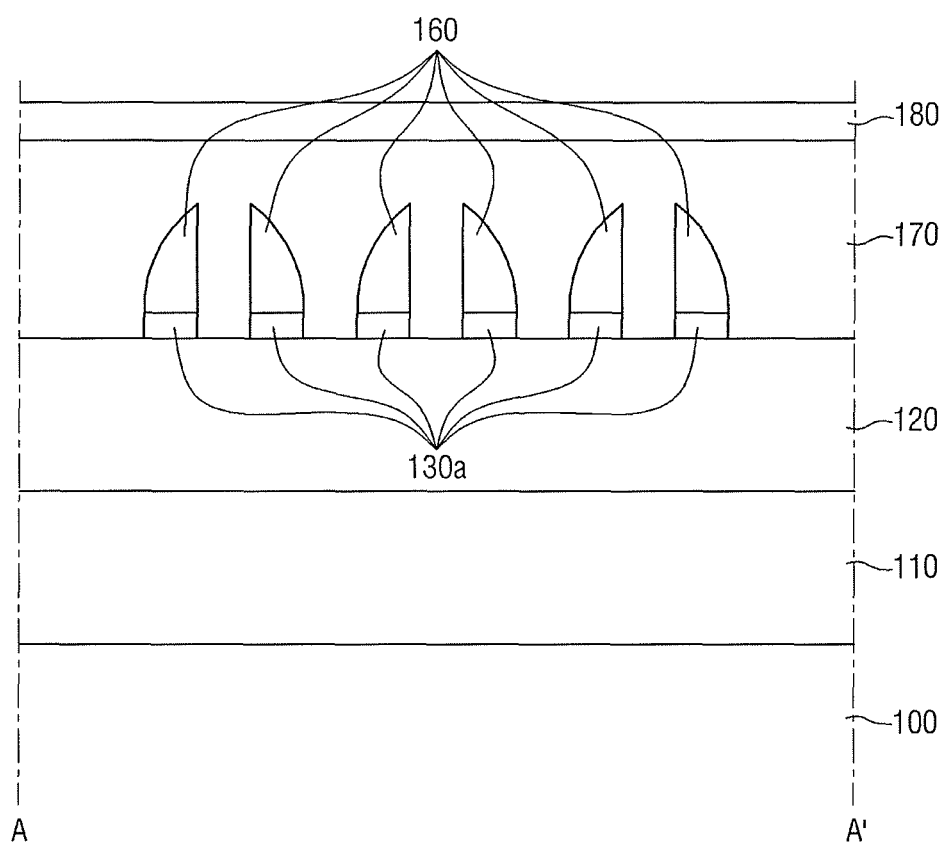

FIG. 4A illustrates another process operation according to the present method, and FIG. 4B illustrates a view taken along section line A-A' in FIG. 4A. Referring to FIGS. 4A and 4B, an interlayer film 170 may be formed over the first spacer 160 and the second mask film 120. A second buffer film 180 may be on the interlayer film 170. The interlayer film 170 may cover the top surface of the second mask film 120 and may fill the gap between the first spacers 160 spaced apart from one another. The interlayer film 170 may include, for example, a SOH.

Figure 5A:
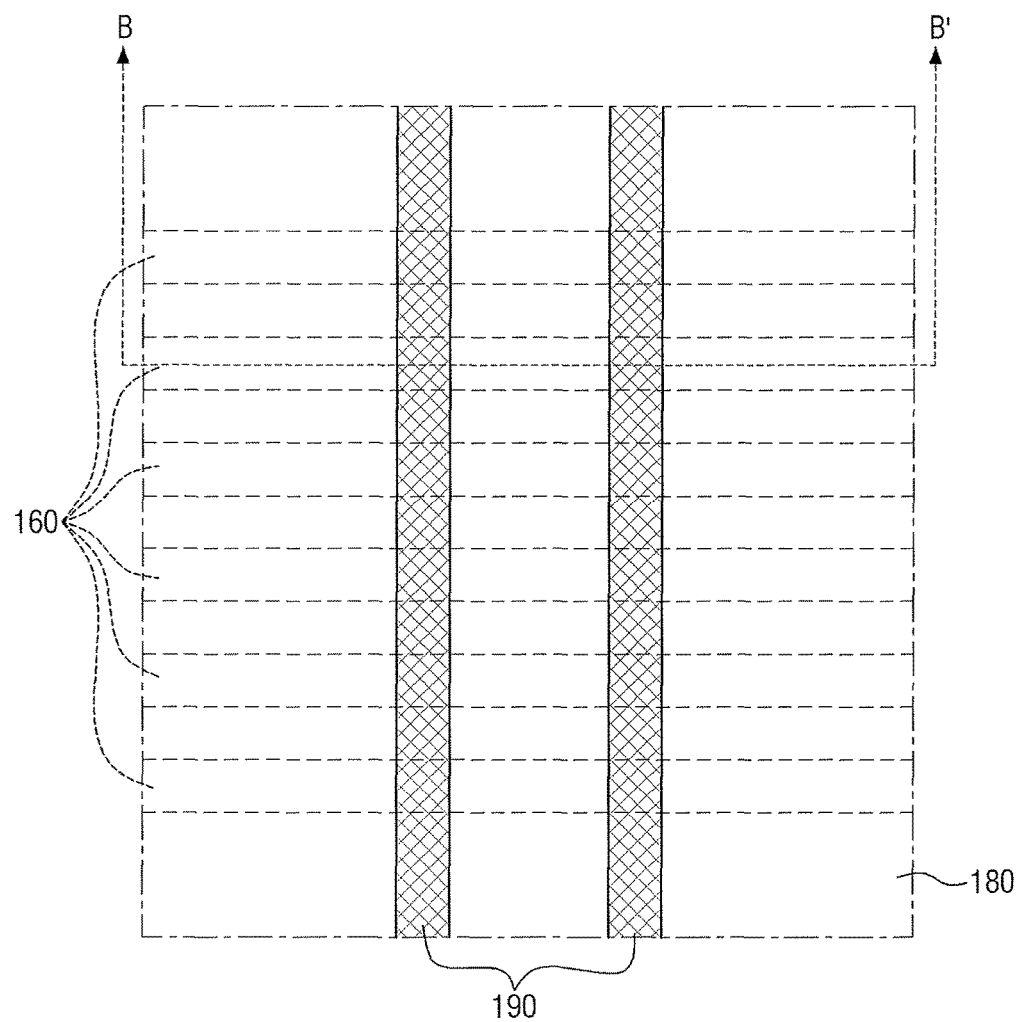
Figure 5B:
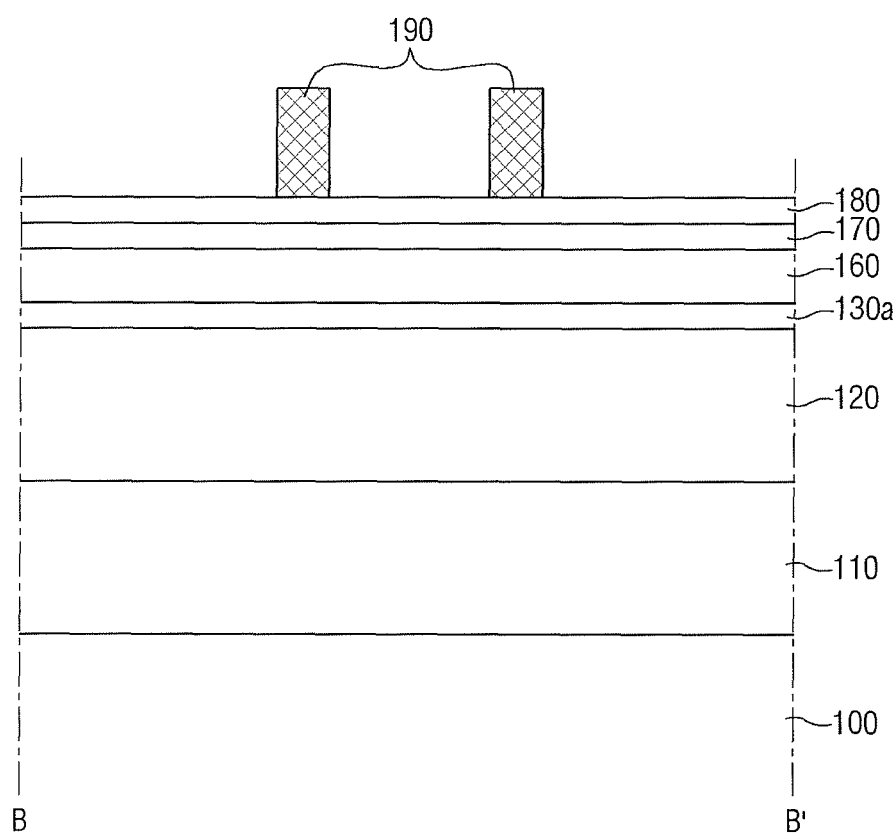

FIG. 5A illustrates another operation according to the present method, and FIG. 5B illustrates a view taken along section line B-B' in FIG. 5A. Referring to FIGS. 5A and 5B, a second sacrificial pattern 190 may be formed on the second buffer film 180 disposed on the interlayer film 170 covering the first spacer 160 and the second mask film 120. The second sacrificial pattern 190 may extend in a second direction different from the direction in which the first spacer 160 extends. Thus, the second sacrificial pattern 190 may intersect the first spacer 160.

As shown in FIG. 5A, the second sacrificial pattern 190 may extend to be perpendicular to the first spacer 160. In another embodiment, the second sacrificial pattern 190 may be oriented at an acute angle relative to the first spacer 160. When the second sacrificial pattern 190 is at an acute angle relative to the first spacer 160, the contact holes formed by the present method may be arranged in a honeycomb pattern.

The second sacrificial pattern 190 may be formed in the same manner as the first sacrificial pattern 150. The second sacrificial pattern 190 may be formed by disposing a second sacrificial film on the second buffer film 180 and then etching the second sacrificial film using a photolithography process. The second sacrificial pattern 190 may include, for example, a SOH.

Figure 6A:
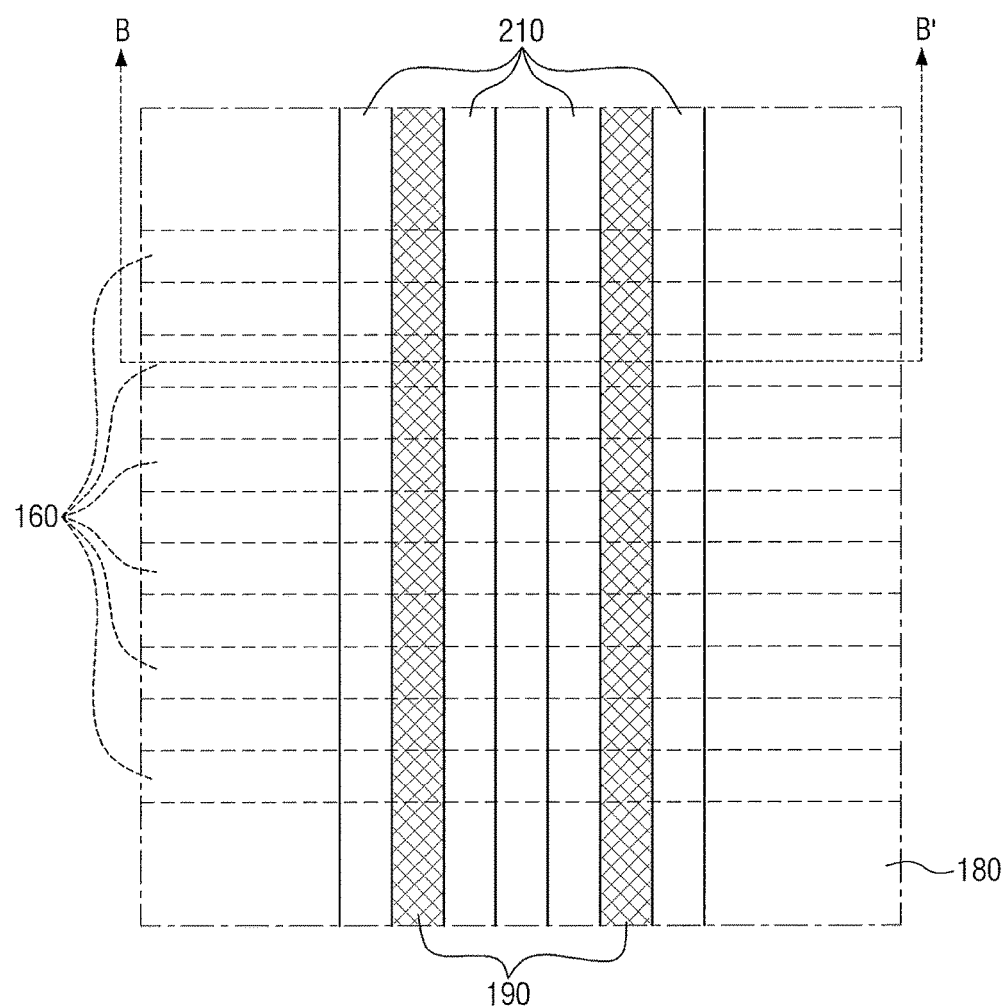
Figure 6B:
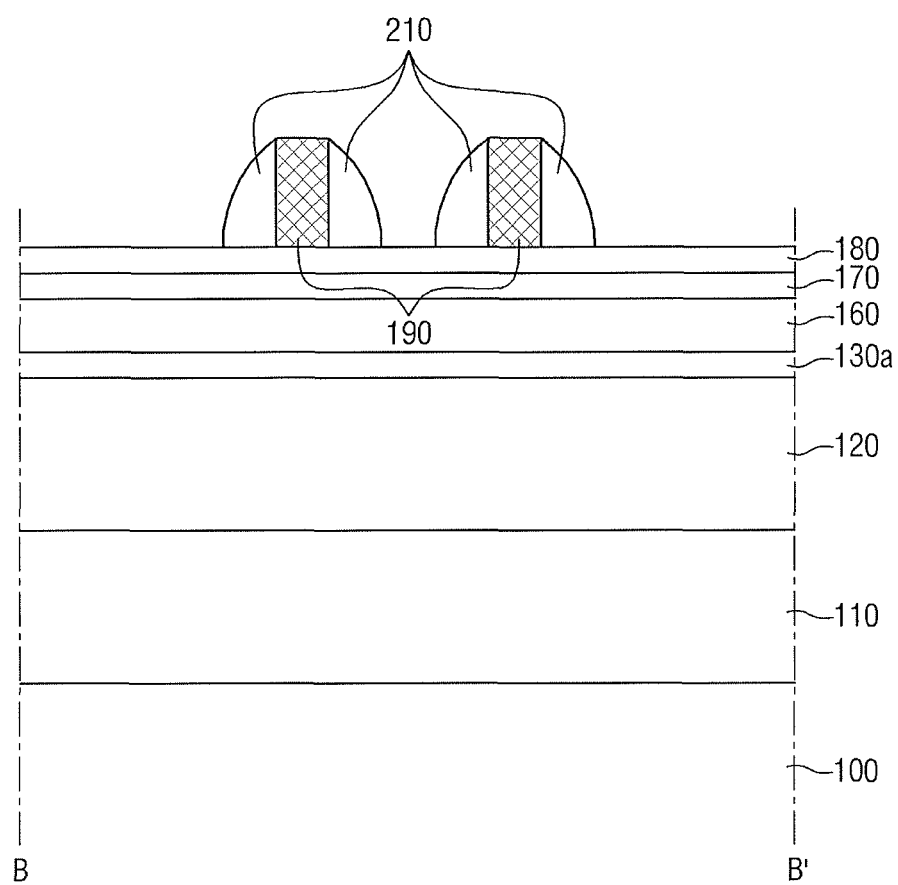

FIG. 6A illustrates another process operation according to the present method, and FIG. 6B illustrates a view taken along section line B-B' in FIG. 6A. Referring to FIGS. 6A and 6B, a second spacer 210 may be formed on either side wall of the second sacrificial pattern 190. The second spacer 210 may be formed in the same manner as the first spacer 160. For example, a material having an etch selectivity different from that of the second buffer film 180 and the second sacrificial pattern 190 is deposited, for example, by ALD and is etched back to thereby form the second spacer 210.

Because the second spacer 210 is formed on either side of the second sacrificial pattern 190, the second spacer 210 may extend in the same direction as the second sacrificial pattern 190. Because the second sacrificial pattern 190 is formed in the direction intersecting the first spacer 160, the second spacer 210 may extend to intersect the first spacer 160.

Figure 7A:
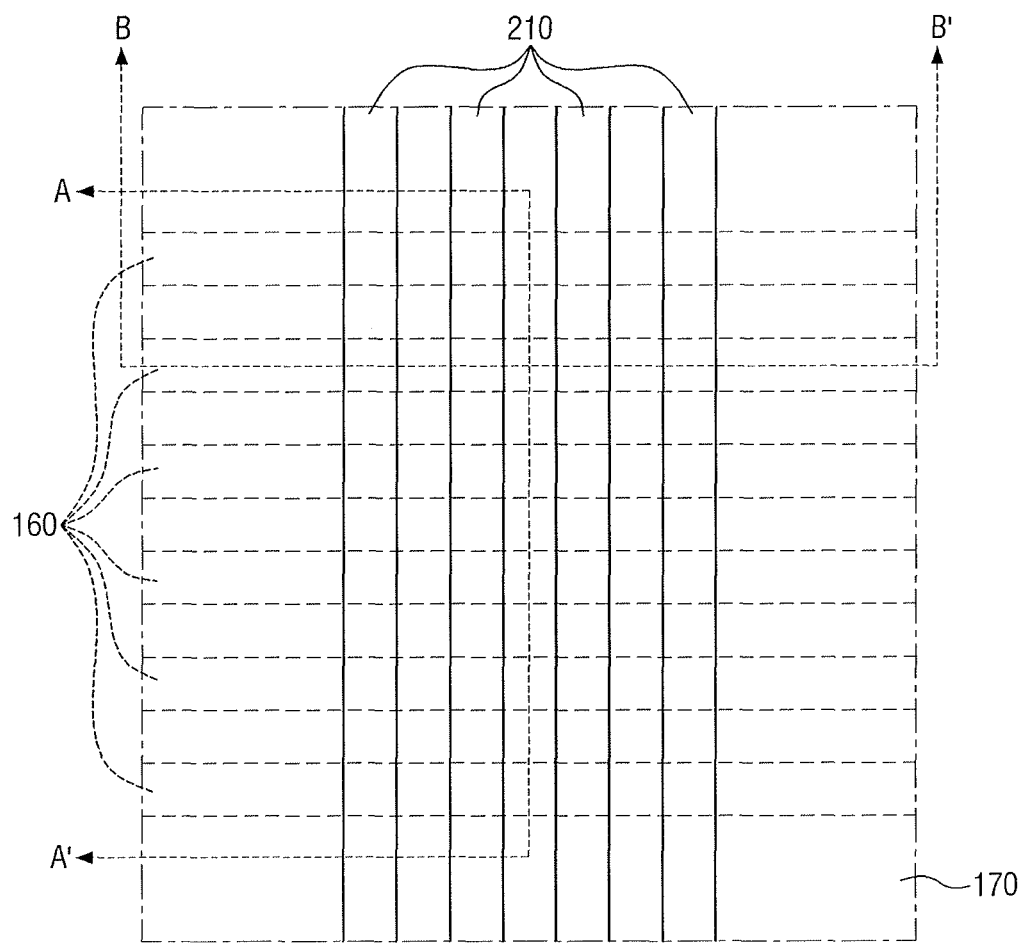
Figure 7B:
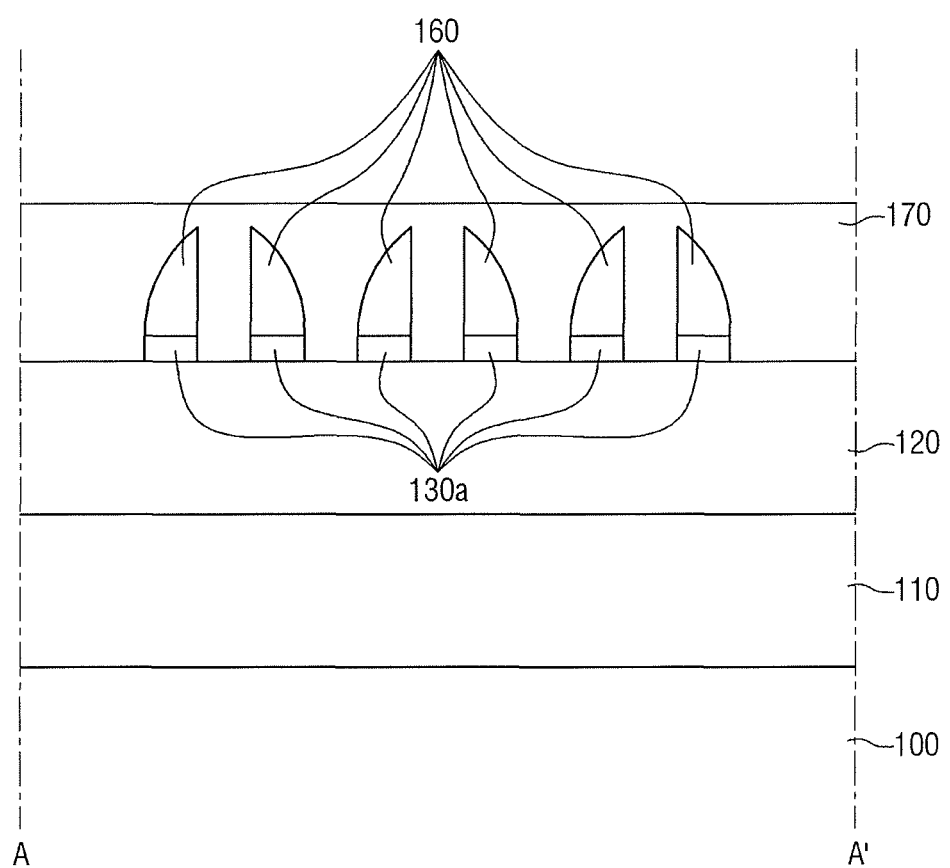
Figure 7C:
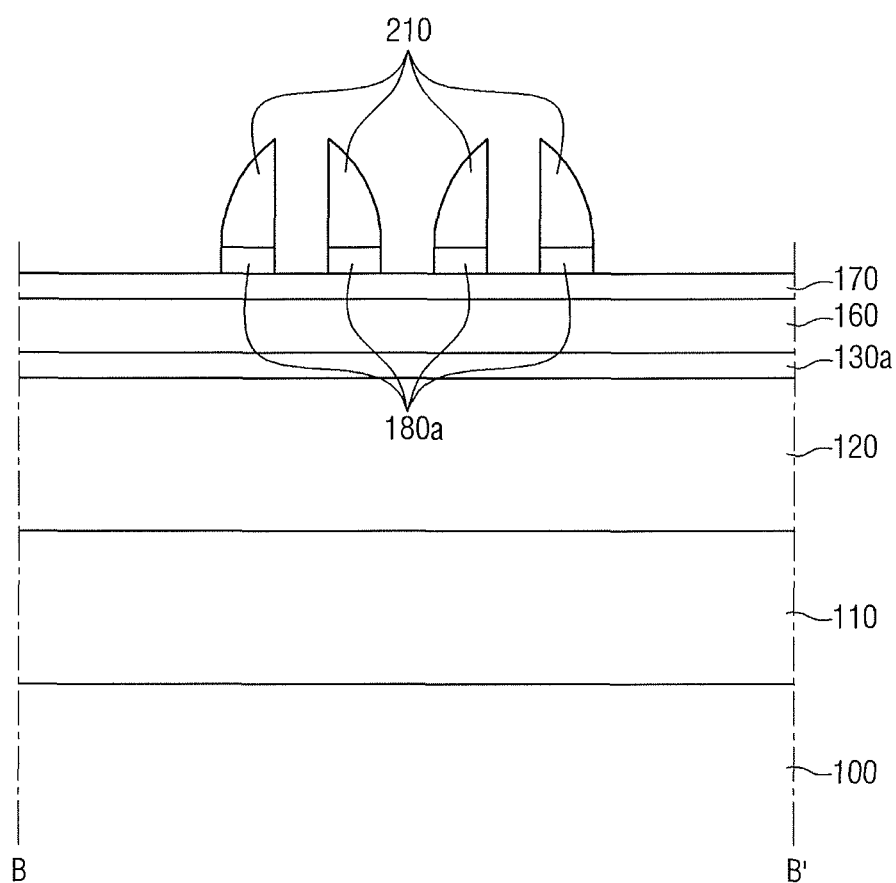

FIG. 7A illustrates another process operation according to the present method, and FIGS. 7B and 7C are views taken along section lines A-A' and B-B' of FIG. 7A respectively. Referring to FIGS. 7A to 7C, the second sacrificial pattern 190 between the second spacers 210 is removed to form second spacers 210 that are spaced apart from one another. The second buffer film 180 may be removed together with the second sacrificial pattern 150 in the same process operation to allow the second mask pattern 180a to be formed. The second mask pattern 180a may overlap the second spacer 210. The second sacrificial pattern 190 may be removed, for example, by an aching process or a cleaning process.

Figure 8A:
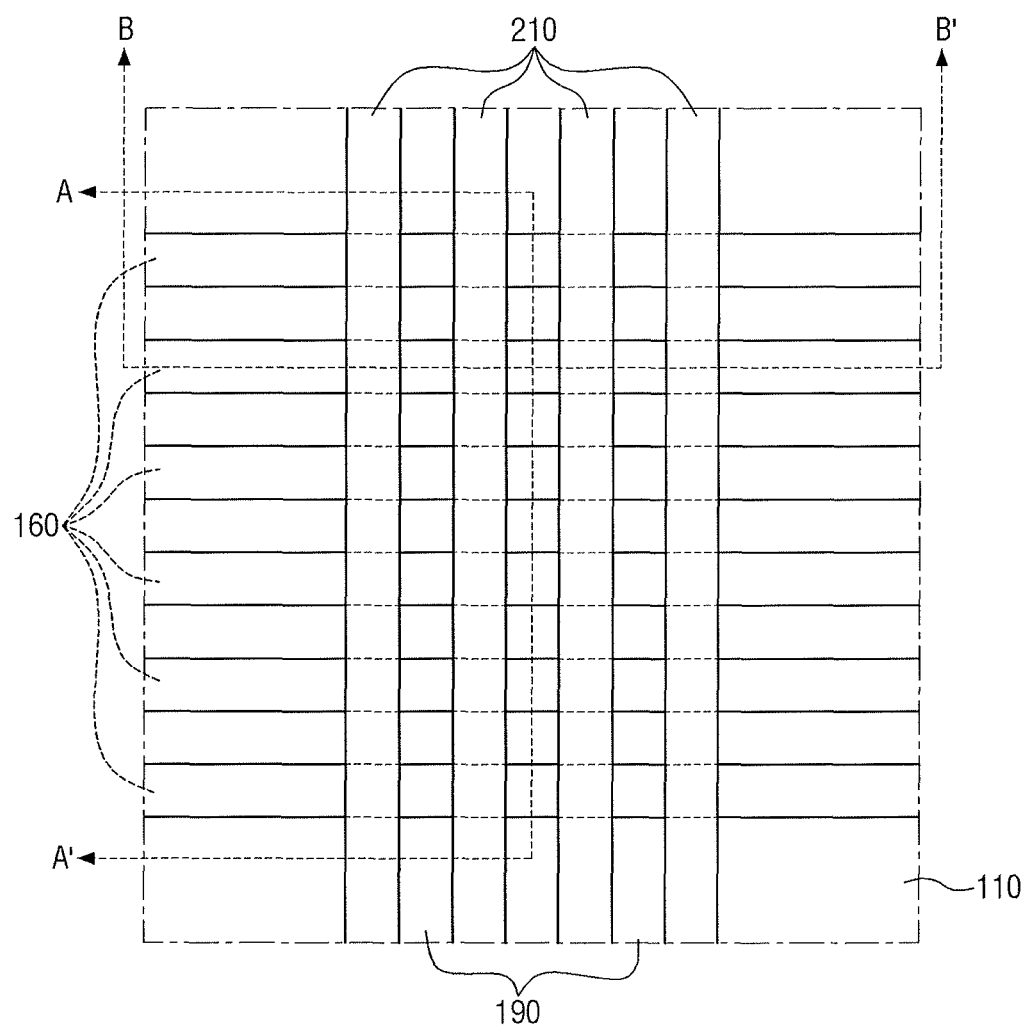
Figure 8B:
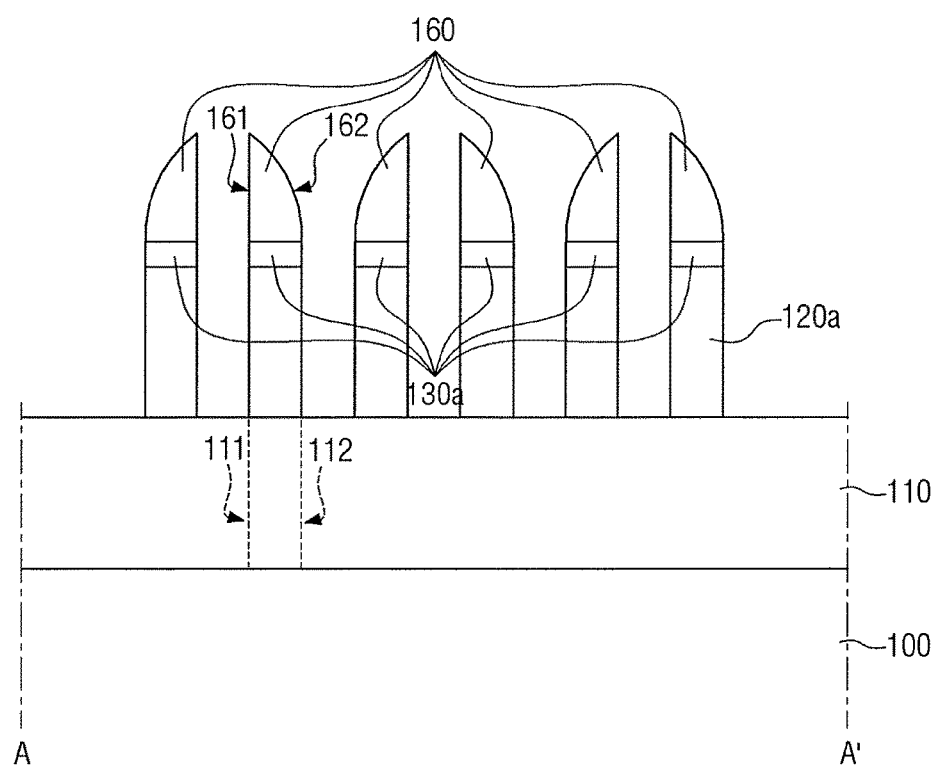
Figure 8C:
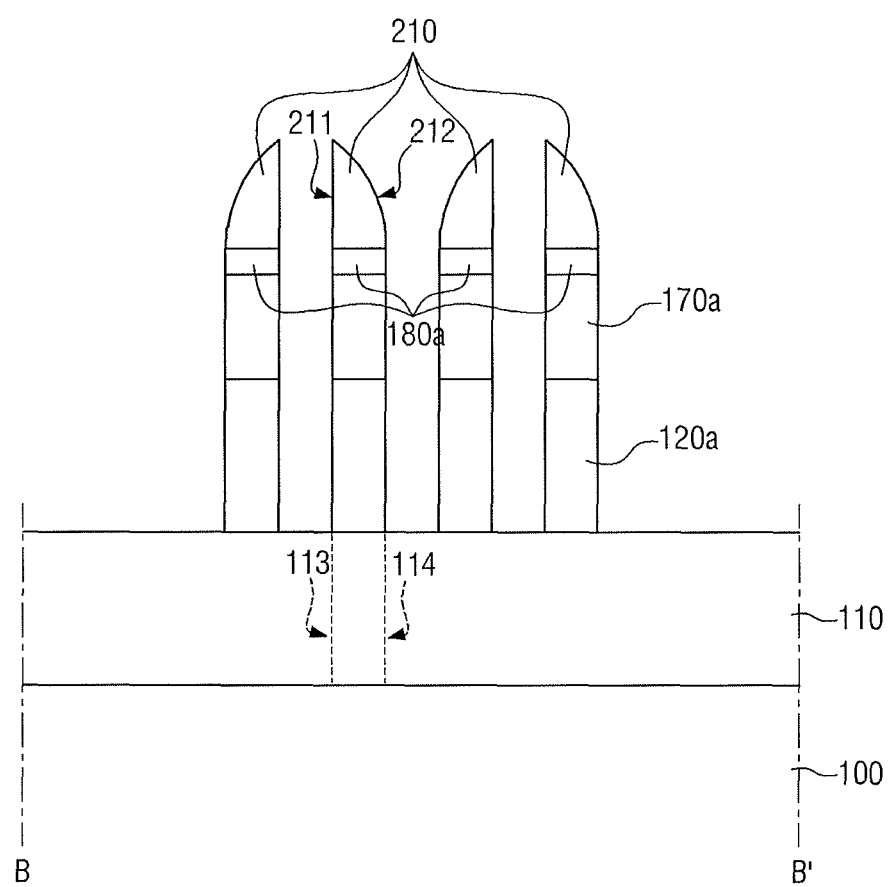

FIG. 8A illustrates another process operation according to the present method, and FIGS. 8B and 8C illustrate views taken along section lines A-A' and B-B' in FIG. 8A, respectively. Referring to FIGS. 8A to 8C, the interlayer film 170 and the second mask film 120 may be etched using the first spacer 160 and the second spacer 210 as etch masks to form a contact pattern 120a. The interlayer film 170 and the second mask film 120 may be etched, for example, by wet etching.

As described above, the first spacer 160 is formed by conformally disposing a spacer film on the side walls of the first sacrificial pattern 150 and then etching back the spacer film. As a result, the first spacer 160 may have asymmetric features, e.g., may have side surfaces 161 and 162 with different features. For example, the first side surface 161 of the first spacer 160 that was in contact with the first sacrificial pattern 150 may extend along a straight line perpendicular to the top surface of the substrate 100. The second side surface 162 of the first spacer 160 may be exposed to an etchant more than the first side surface 161 during the process of etching back the first spacer film. Thus, the second side surface 162 may be rounded or chamfered.

Accordingly, if the first mask film 110 is etched using the asymmetric first spacer 160 as an etch mask, the portion of the first mask film 110 under the first side surface 161 of the first spacer 160 is less etched than the portion of the first mask film 110 under the second side surface 162. For example, the etched length of a second surface 112 of the first mask film 110 under the second side surface 162 of the first spacer 160 may be greater than the etched length of a first surface 111 of the first mask film 110 under the first side surface 161 of the first spacer 160.

Likewise, the second spacer 210 may have asymmetric features, e.g., the second spacer 210 may have side surfaces 211 and 212 with different features. Accordingly, the etched length of a fourth surface 114 of the first mask film 110 under the second side surface 212 of the second spacer 210 may be greater than the etched length of a third surface 113 of the first mask film 110 under the first side surface 211 of the second spacer 210.

As such, if contact holes are formed by etching the first mask film 110 using the asymmetric first and second spacers 160 and 210 as etch masks, the contact holes may also have asymmetric features. For example, when DPT is respectively performed twice with the first spacer 160 and with the second spacer 210, the difference in the etched lengths between two surfaces becomes larger, e.g., more asymmetric.

Figure 9A:
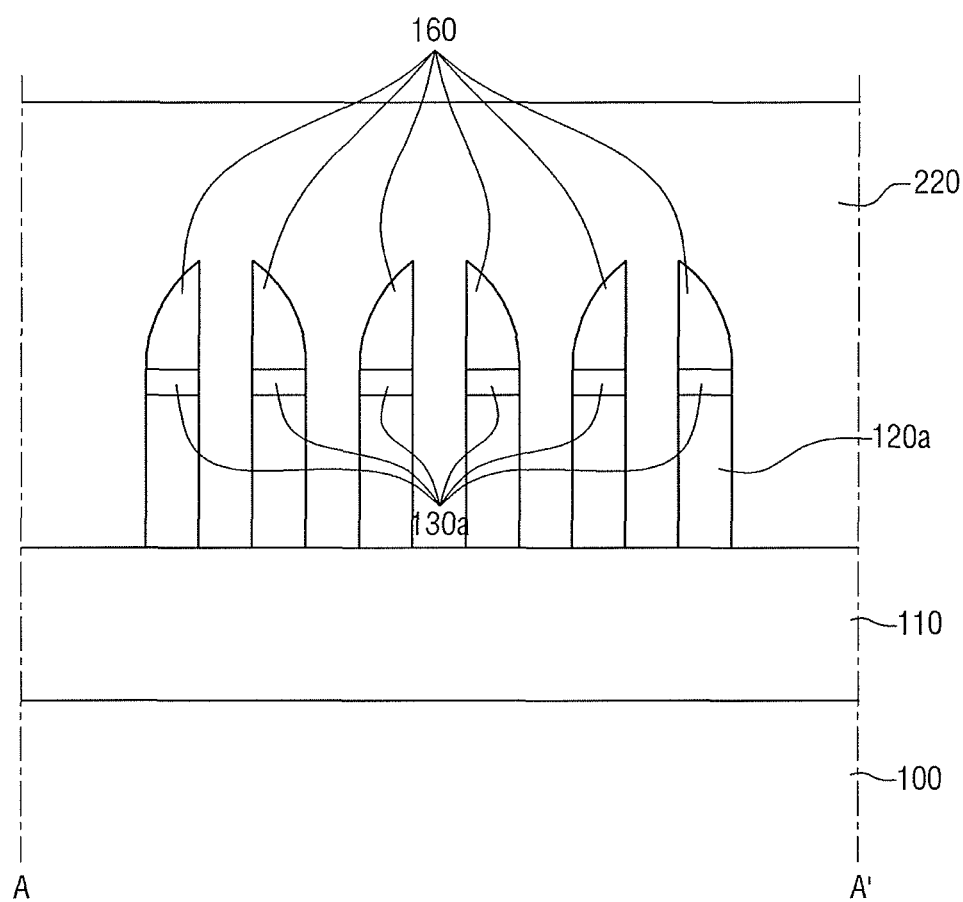
Figure 9B:
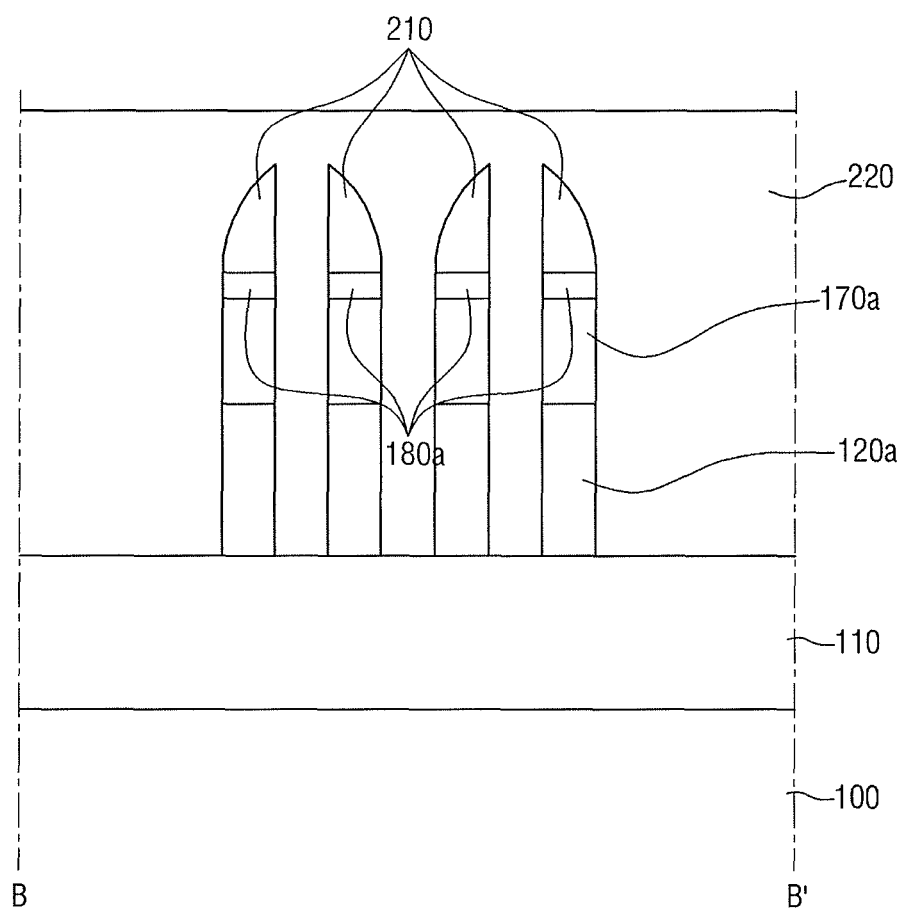

FIGS. 9A and 9B illustrate additional process operations according to the present method. Referring to FIGS. 9A and 9B, a third sacrificial film 220 may be formed to cover the first mask film 110 and the first and second spacers 160 and 210. The third sacrificial film 220 may include the same material as the interlayer film 170, e.g., a SOH.

Figure 10A:
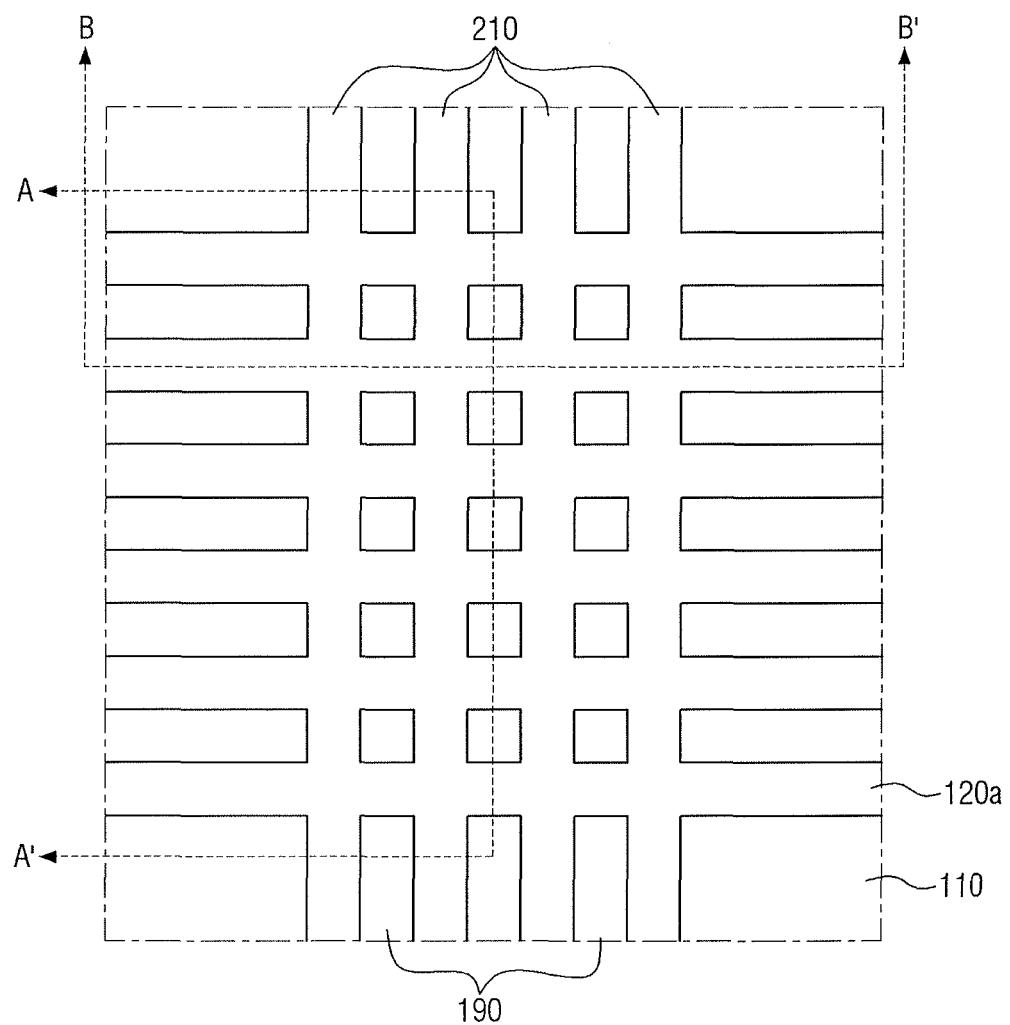
Figure 10B:
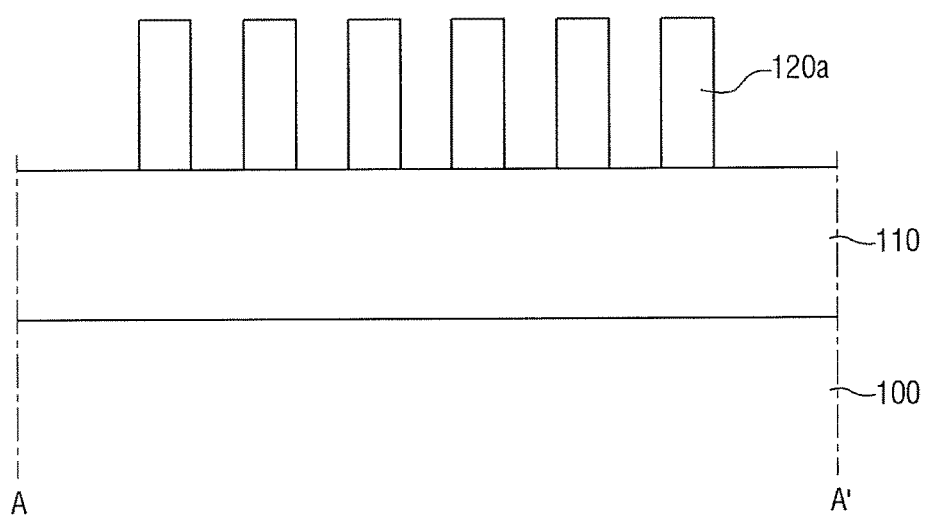
Figure 10C:
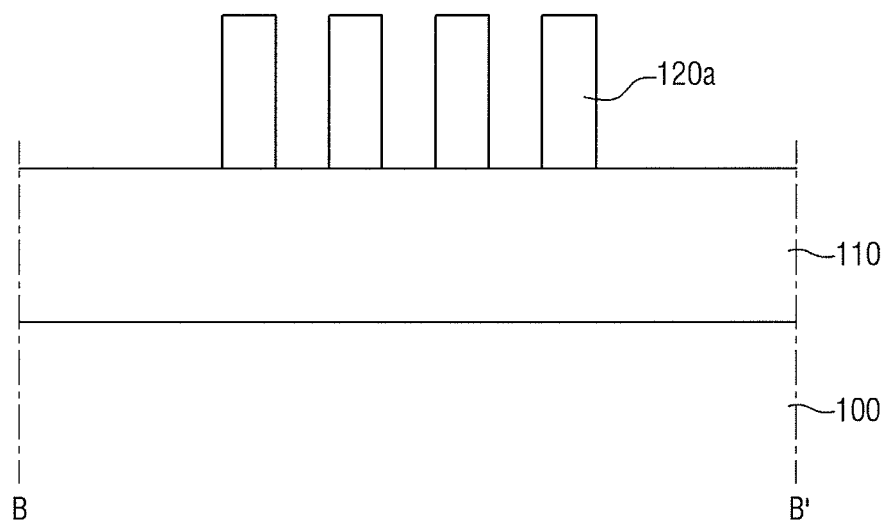

FIG. 10A illustrates another process operation according to the present method, and FIGS. 10B and 10C illustrate views taken along section lines A-A' and B-B' of FIG. 10A, respectively. Referring to FIGS. 10A to 10C, the first mask pattern 130a, the first spacer 160, the second spacer 210, and the third sacrificial film 220 are removed to expose the contact pattern 120a. The first and second spacers 160 and 210 and the first mask pattern 130a may be removed, for example, by etching-back or the chemical mechanical polishing (CMP). In addition, the third sacrificial film 220 including a SOH may be removed, for example, by an ashing process.

As described above, the contact pattern 120a may be exposed by removing the asymmetric first and second spacers 160 and 210. The asymmetric features of the first and second spacers 160 and 210 are not transferred to the contact pattern 120a. Thus, the contact pattern 120 may have symmetric features. Accordingly, it is possible to prevent a contact hole from having asymmetric features when etching is performing using asymmetric mask patterns in a subsequent process. As a result, operation reliability of a semiconductor device fabricated by a method according to the present exemplary embodiment may be improved.

Figure 11A:
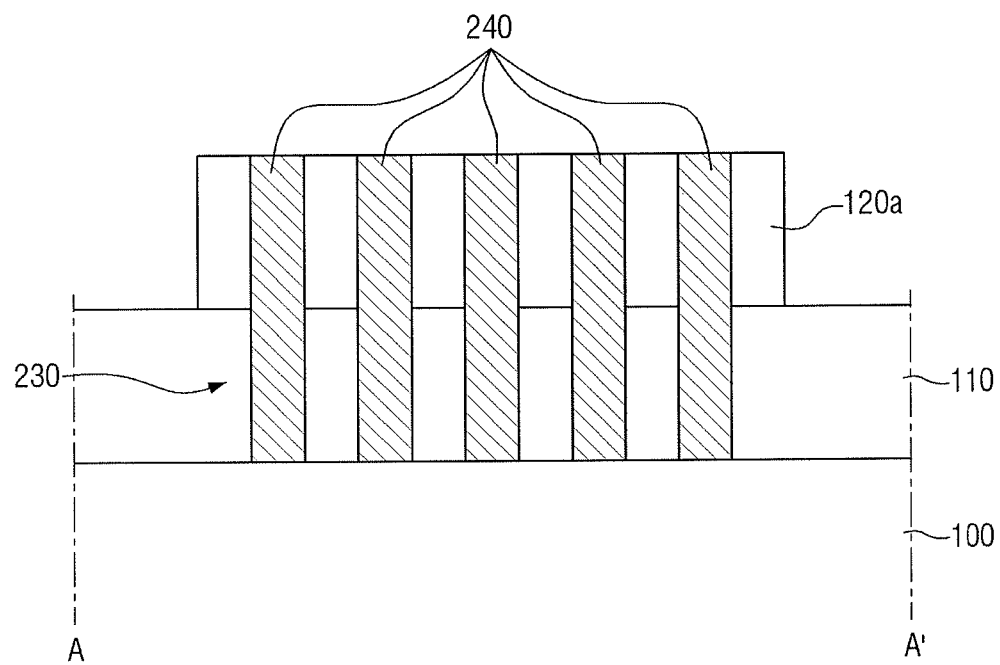
Figure 11B:
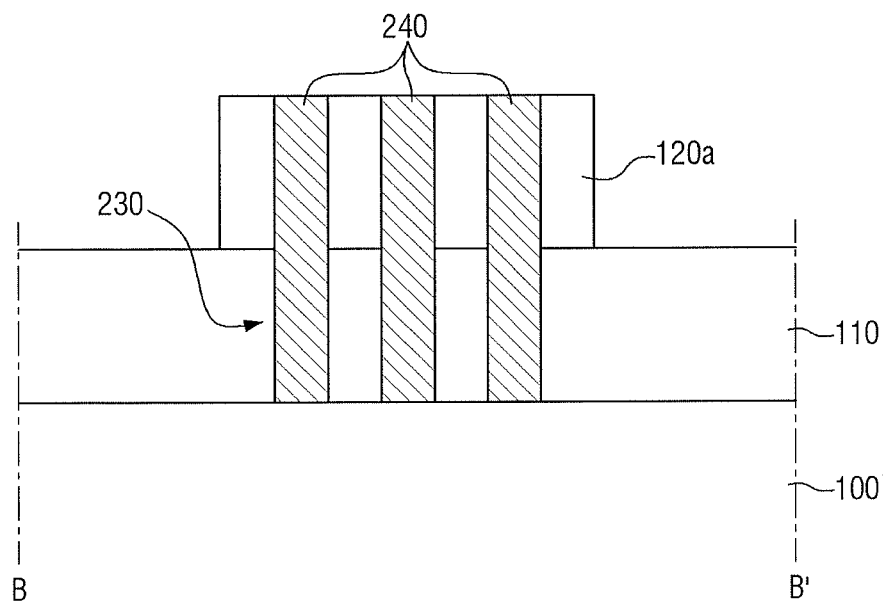

FIGS. 11A and 11B illustrate process operations according to the present or another embodiment of a method for fabricating a semiconductor device. Referring to FIGS. 11A and 11B, the first mask film 110 may be etched using the contact pattern 120a as an etch mask to form a contact hole 230. In addition, the contact hole 230 may be filled with a conductive material to form a contact plug 240. The contact plug 240 may be electrically connected to a capacitor in the substrate.

In this method, the contact pattern 120a may include a material having a higher etch selectivity than the first mask film 110. By etching the first mask film 110 using the contact pattern 120a as an etch mask, the contact pattern 120a containing a material having a higher etch selectivity may be removed to a lesser degree. As a result, the thickness of the second mask film 120 for forming the contact pattern 120 may also be reduced.

Figure 12:
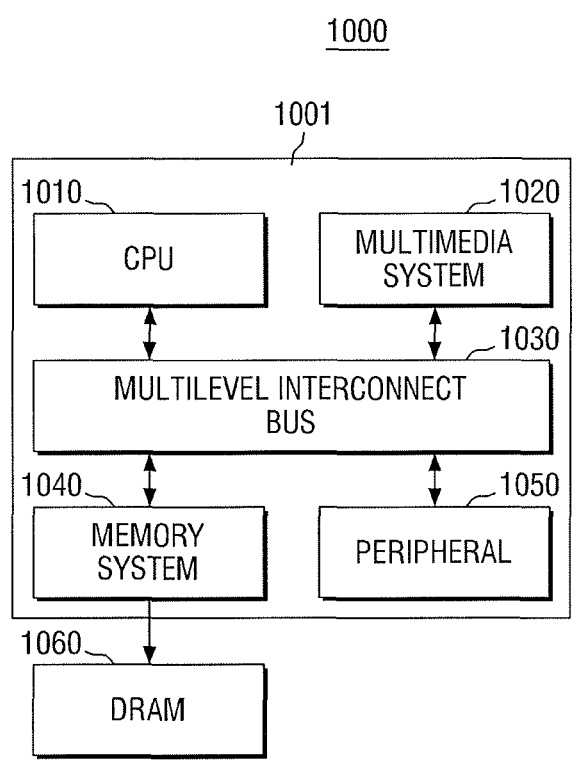
FIG. 12 illustrates an embodiment of a system-on-chip (SoC)

FIG. 12 illustrates an embodiment of a system-on-chip (SoC) including a semiconductor device fabricated according to any of the aforementioned embodiments. Referring to FIG. 12, the SoC 1000 may include an application processor 1001 and a DRAM 1060. The application processor 1001 may include a CPU 1010, a multimedia system 1020, a multi-level interconnect bus 1030, a memory system 1040 and a peripheral circuit 1050. The CPU 1010 may perform operations necessary for driving the SoC 1000. In some exemplary embodiments, the CPU 1010 may be configured in a multi-core environment including multiple cores.

The multimedia system 1020 may be used in the SoC system for performing various multimedia functions. The multimedia system 1020 may include a 3D engine module, video codec, a display system, a camera system, a post-processor, etc.

The multi-level interconnect bus 1030 may be used for data communications among the CPU 1010, the multimedia system 1020, the memory system 1040, and the peripheral circuit 1050. In some exemplary embodiments, the multi-level interconnect bus 1030 may have a multi-layer structure. Examples of the multi-level interconnect bus 1030 include, but are not limited to, a multi-layer AHB (Advanced High-performance Bus) and a multi-layer AXI (Advanced eXtensible Interface).

The memory system 1040 may provide the application processor 1001 with an environment for high speed operation with an external memory (e.g., DRAM 1060). In some exemplary embodiments, the memory system 1040 may include an additional controller (e.g., a DRAM controller) for controlling an external memory (e.g., DRAM 1060).

The peripheral 1050 may provide an environment for facilitating connection between the SoC system 1000 and an external device (e.g., a main board). Accordingly, the peripheral circuit 1050 may have various interfaces that make external devices connected to the SoC system 1000 compatible with the system.

The DRAM 1060 may work as an operational memory for the application processor 1001. In some exemplary embodiments of the present disclosure, the DRAM 1060 may be outside the application processor 1001, for example, as shown in FIG. 11. In one embodiment, the DRAM 1060 may be packaged with the application processor 1001 as a package-on-package (PoP) assembly.

At least one of the elements of the SoC 1000 may employ the semiconductor device fabricated according to any one of the above-described exemplary embodiments.

Figure 13:
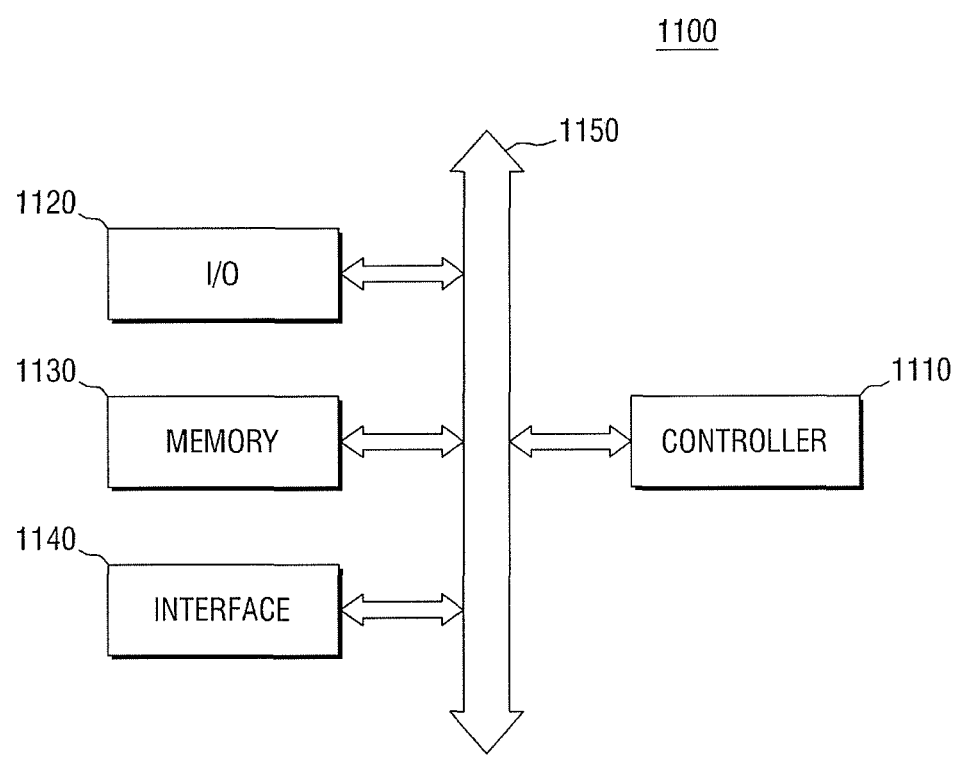
FIG. 13 illustrates an embodiment of an electronic system.

FIG. 13 illustrates an embodiment of an electronic system 1100 which includes the semiconductor device and the SoC fabricated according to the aforementioned exemplary embodiments. Referring to FIG. 13, the electronic system 1100 may include a controller 1110, an I/O (input/output) device 1120, a memory device 1130, an interface 1140, and a bus 1150. The controller 1110, the I/O device 1120, the memory device 1130, and/or the interface 1140 may be connected to one another via the bus 1150. The bus 1150 may serve as a path via which data is transferred.

The controller 1110 may include at least one of a microprocessor, a digital signal processor, a microcontroller, or logic elements for performing predetermined functions. The I/O device 1120 may include a keypad, a keyboard, a display device, etc. The memory device 1130 may store data and/or instructions, for example. The interface 1140 may transmit/receive data to/from a communication network. The interface 1140 may be either a wired or wireless interface. For example, the interface 1140 may include an antenna, a wired/wireless transceiver or the like.

The electronic system 1100 is an operational memory for improving the operation of the controller 1100 and, for example, may further include a high-speed DRAM and/or SRAM. The semiconductor device fabricated according to any one of the above-described exemplary embodiments may serve as the operational memory to thereby improve reliability of the semiconductor device.

Additionally, the semiconductor device fabricated according to the exemplary embodiments may be provided in the memory device 1130 or may be provided as a part of the controller 1110, the I/O device 1120, etc.

The electronic system 1100 may be applied to a PDA (personal digital assistant), a portable computer, a web tablet, a wireless phone, a mobile phone, a digital music player, a memory card, or any electronic device for transmitting/receiving information in wireless environment.

Figure 14:
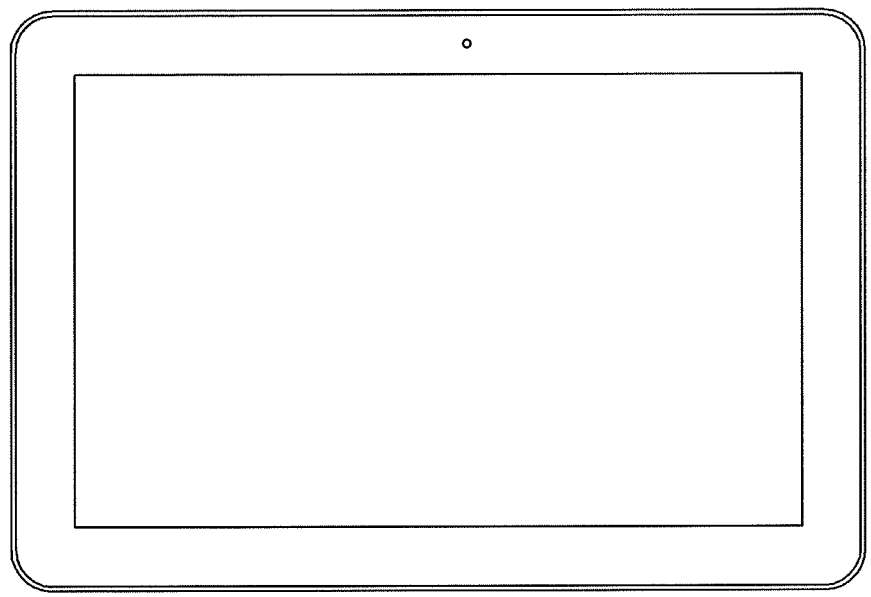
FIGS. 14 to 16 illustrate embodiments of semiconductor systems.
Figure 15:
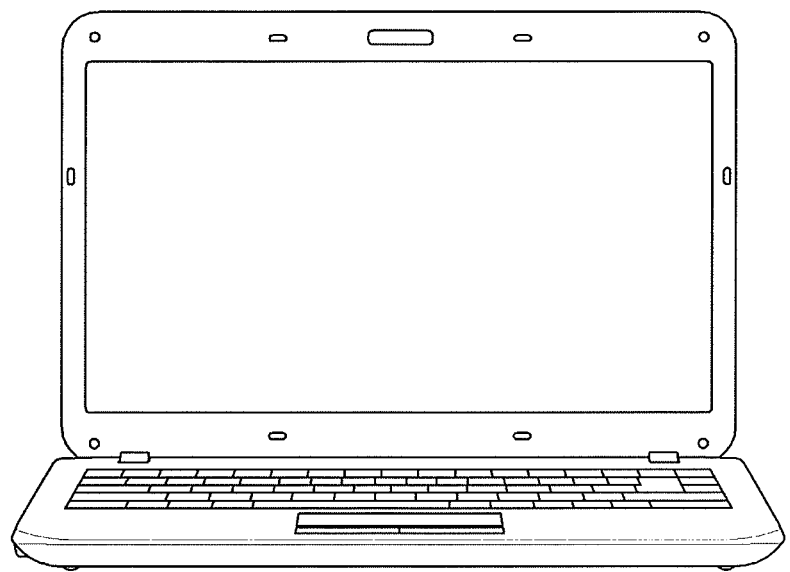
Figure 16:
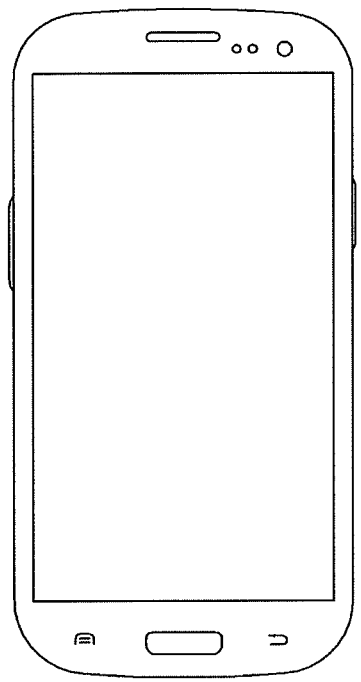

FIGS. 14 to 16 illustrate examples of semiconductor systems that include the semiconductor devices according to the aforementioned embodiments. FIG. 14 shows a tablet PC 1200, FIG. 15 shows a laptop computer 1300, and FIG. 16 shows a smartphone 1400. At least one of the semiconductor devices fabricated according to the exemplary embodiments may be employed by the tablet PC 1200, the laptop computer 1300, the smartphone 1400, etc.

A semiconductor device fabricated according to the exemplary embodiments of may be employed by integrated circuit devices than those mentioned above, e.g., other than the tablet PC 1200, the laptop computer 1300 and the smartphone 1400.

In some exemplary embodiments, the semiconductor system may be implemented as a computer, UMPC (Ultra Mobile PC), a workstation, a net-book, a PDA (Personal Digital Assistants), a portable computer, a wireless phone, a mobile phone, an e-book, a PMP (portable multimedia player), a portable game console, a navigation device, a black box, a digital camera, a 3-dimensional television, a digital audio recorder, a digital audio player, a digital picture recorder, a digital picture player, a digital video recorder, a digital video player, etc.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A method of fabricating a semiconductor device, the method comprising:
forming a first mask pattern on a first film, the first mask pattern extending in a first direction;
forming a first spacer on either side wall of the first mask pattern;
forming a second film to cover the first spacer and the first film;
forming a second mask pattern on the second film, the second mask pattern extending in a second direction different from the first direction;
forming a second spacer on either side wall of the second mask pattern;
etching the first film using the first spacer and the second spacer as etch masks to form a contact pattern; and
removing the first and second spacers to expose the contact pattern.

2. The method as claimed in claim 1, further comprising:
forming a first buffer film on the first film before forming the first mask,
wherein forming the first spacer includes etching the first buffer film to form a first buffer film pattern.

3. The method as claimed in claim 1, further comprising:
forming a second buffer film on the second film before forming the second mask, wherein forming the second spacer includes etching the second buffer film to form a second buffer film pattern.

4. The method as claimed in claim 1, wherein the first direction is perpendicular to the second direction.

5. The method as claimed in claim 1, wherein the first mask pattern includes a plurality of patterns extending the first direction and being spaced apart from each other in the second direction, and wherein the second mask pattern includes a plurality of patterns extending the second direction and being spaced apart from each other in the first direction.

6. The method as claimed in claim 1, further comprising:
prior to removing the first and second spacers, forming a third film to cover the first and second spacers, wherein removing the first and second spacers includes removing the third film together with the first and second spacers.

7. The method as claimed in claim 6, wherein the third film includes a same material as the second film.

8. The method as claimed in claim 1, further comprising:
forming a mask film under the first film; and
etching the mask film using the contact pattern as an etch mask to form a contact hole.

9. The method as claimed in claim 8, wherein the first film includes a material having a higher etch selectivity than the mask film.

10. The method as claimed in claim 9, wherein the first film includes one of polysilicon, silicon nitride, metal oxide, or metal nitride.

11. The method as claimed in claim 2, wherein the first buffer film includes a same material as the first film.

12. A method of fabricating a semiconductor device, the method comprising:
forming a first mask film on a substrate, a second mask film on the first mask film, a first buffer film on the second mask film, a first sacrificial film on the first buffer film;
etching the first sacrificial film to form a first sacrificial pattern extending in a first direction;
forming a first spacer on either side wall of the first sacrificial pattern;
etching the first buffer film using the first spacer as an etch mask to form a first mask pattern;
forming a second buffer film over the first mask pattern and the second mask film, and forming a second sacrificial film on the second buffer film;
etching the second sacrificial film to form a second sacrificial pattern extending in a second direction different from the first direction;
forming a second spacer on either side wall of the second sacrificial pattern;
etching the second buffer film using the second spacer as an etch mask to form a second mask pattern;
etching the second mask film using the first mask pattern and the second mask pattern as etch masks to form a contact pattern;
removing the first mask pattern and the first and second spacers to expose the contact pattern; and
etching the first mask film using the contact pattern as an etch mask to form a contact hole.

13. The method as claimed in claim 12, wherein the second mask film includes a same material as the first buffer film.

14. The method as claimed in claim 12, further comprising:
filling the contact hole with a conductive material to form a contact plug.

15. The method as claimed in claim 12, further comprising:
prior to removing the first mask pattern and the first and second spacers, forming a third sacrificial film to cover the contact pattern and the first and second spacers; and
removing the third sacrificial film together with the first and second mask pattern.

16. The method as claimed in claim 15, wherein the third sacrificial film includes a same material as the second sacrificial film.

17. The method as claimed in claim 16, wherein the second mask film and the first buffer film includes silicon nitride or silicon.

18. A method of fabricating a semiconductor device, the method comprising:
forming a first mask pattern on a first film, the first mask pattern extending in a first direction;
forming a first spacer on either side wall of the first mask pattern;
forming a second film to fill a space between the first spacer;
forming a second mask pattern on the second film, the second mask pattern intersecting the first mask pattern;
forming a second spacer on either side wall of the second mask pattern;
etching the first film and the second film using the first spacer and the second spacer as etch masks to form a contact pattern;
forming a sacrificial film to fill a space between the contact pattern and to cover the first spacer and the second spacer; and
removing the sacrificial film together with the first spacer and the second spacer.

19. The method as claimed in claim 18, wherein the sacrificial film includes same material as the second film.

20. The method as claimed in claim 19, wherein the sacrificial film and the second film include a spin-on hardmask (SOH).

* * * * *